United States Patent [19]

Scharf

[11] Patent Number: 5,212,383
[45] Date of Patent: May 18, 1993

[54] COLOR SYNTHESIZING SCANNING ELECTRON MICROSCOPE

[76] Inventor: David Scharf, 2100 Loma Vista Pl., Los Angeles, Calif. 90039

[21] Appl. No.: 737,942

[22] Filed: Jul. 29, 1991

[51] Int. Cl.$^5$ ............................................. H01J 37/28
[52] U.S. Cl. ..................................... 250/310; 250/397
[58] Field of Search ................................ 250/310, 397

[56] References Cited

U.S. PATENT DOCUMENTS

| | | |
|---|---|---|
| 3,628,014 | 12/1971 | Grubic, Jr. . |
| 3,812,288 | 5/1974 | Walsh et al. . |
| 3,927,320 | 12/1975 | Chatfield .............................. 250/307 |
| 4,041,311 | 8/1977 | Martin . |
| 4,068,123 | 1/1978 | Kokubo . |
| 4,420,686 | 12/1983 | Onoguchi et al. . |
| 4,439,680 | 3/1984 | Broadhurst . |
| 4,560,872 | 12/1985 | Antonovsky . |
| 4,588,890 | 5/1986 | Finnes . |
| 4,673,988 | 6/1987 | Jamsson et al. ...................... 250/307 |
| 4,857,731 | 8/1989 | Tagata . |
| 4,894,540 | 1/1990 | Komatsu . |
| 4,943,722 | 7/1990 | Breton ................................. 250/310 |

Primary Examiner—Bruce C. Anderson
Attorney, Agent, or Firm—Robbins, Dalgarn, Berliner & Carson

[57] ABSTRACT

A color synthesizing scanning electron microscope having a scanning primary beam of electrons directed toward a specimen, is configured to produce color images of high information content. The microscope comprises at least two wide energy bandwidth secondary electron detectors, arranged around the specimen at predetermined variable angles, for receiving electron emission from the specimen subsequent to incidence of the scanning primary electron beam. The wide energy bandwidth secondary detectors detect electrons with trajectory or positional differences and convert the positional differences to signals for synthesizing color. The signals from the wide energy bandwidth secondary electron detectors are combined to generate signals representative of different colors. Additional signals representing a difference between any two input signals from the wide energy bandwidth secondary detectors can also be generated.

21 Claims, 7 Drawing Sheets 14,16,18

14,16,18

COLOR SYNTHESIZING SCANNING ELECTRON MICROSCOPE

FIELD OF THE INVENTION

The present invention relates generally to the field of scanning electron microscopes (SEM). More specifically, the present invention relates to a color synthesizing scanning electron microscope configured to produce color images of high information content by arranging at least two wide energy bandwidth secondary detectors around a specimen, to detect electrons with trajectory or positional differences.

BACKGROUND OF THE INVENTION

Scanning electron microscopes are commonly used for observation and analysis of matter. Scanning electron microscopes have found broad application in the transistor industry to show voltage distribution in such devices. Other uses include industrial quality control and a broad range of industrial and biological research.

A scanning electron microscope typically includes a vacuum chamber, an electron optical system for generating and focusing an electron beam (referred to also as the primary electron beam) at a specimen, a deflection system for moving the beam across a specimen in a predetermined raster pattern, a detector system for detecting phenomena from the specimen caused by the impinging primary electron beam, and a display system.

When the primary electron beam strikes the specimen, a complex response is generated, including both short-lived and long-lived phenomena. The short-lived phenomena include secondary electrons (low energy), back-scattered electrons (high energy), x-ray characteristics of the specimen, "white x-rays", light (cathode luminescence), absorbed electrons, transmitted electrons, and auger process electrons (low energy). Detectors for each of the above phenomena are well known in the art.

In a conventional scanning electron microscope, typically at least one of the signals identified above is detected, amplified and displayed on a CRT (cathode ray tube). The amplitude of the signal is used to modulate the intensity of the beam of the CRT. The beam of the CRT is deflected in a raster pattern which corresponds to and is synchronized with the scanning primary electron beam of the SEM. A black and white image of the specimen is thereby presented to the operator of the microscope. The image thus created may be set to contain three types of information at each point on the CRT, two position vectors which identify the location of the primary electron beam on the specimen, and one brightness or intensity level vector which contains information about the specimen. The intensity level is usually derived from the secondary electron emission, which contains topographical (slope) information. The information thus presented is in a form which is readily accepted by the human operator who can rapidly assimilate the information. One or more of the many signals which are induced by the primary electron beam can be displayed in a conventional scanning electron microscope system at any one time.

Each of the various responses of the specimen to the primary electron beam includes unique information about the specimen. For example, the intensity of the secondary electron emission contains information about the slope of the specimen surface, with respect to the primary electron beam. This information can be used to generate an image of the specimen surface. As another example, the back-scattered (high energy) electron signal contains information about the atomic number of the specimen, and thus can be used to provide a profile having an intensity which is representative of the chemical makeup rather than the shape of the specimen under examination. In a conventional scanning electron microscope with display, the operator can observe any one or more than one of these images at a time.

Color synthesizers have been proposed in the prior art to enhance the display image of scanning electron microscopes. For the most part, these color imaging schemes have not increased the information content of the image but have been utilized merely to present a more aesthetically pleasing picture.

Color pictures have been produced photographically by means of multiple exposures of film through appropriately colored filters. One prior system utilizes three separate x-rays, each representative of a different element, which are used to modulate the three electron guns of a color kinescope. That is, each x-ray detector is associated with a different color and these elements are then displayed concurrently and in color. The resultant image defines the distribution of the elements in the specimen since each one is represented by a different color.

In addition, colored images are constructed in which different regions of the image are colored in accordance with a color coding scheme, in such a fashion that variations in a physical variable are represented by different colors in the image. While such colored images convey information in a fashion which can be readily assimilated, the information content is generally no greater than would be conveyed had the colors not been used and the image simply coded monochromatically such as by different shading patterns. This is in contrast to the images normally perceived by the eye where, because of the added mixed light impressions perceived, a variety of lighting effects can be differentiated, which impressions can hardly be adequately represented monochromatically. This arises because a colored image as perceived by the eye can be considered as being made up of three simultaneously perceived images, each of a separate primary color, and the eye is capable of differentiating regions in the image as to which of the relative proportions of the three primary colors vary.

U.S. Pat. Nos. 3,628,014, 4,041,311 and 4,560,872 propose techniques which generate color images from the information available in a scanning electron microscope and display the images on a color CRT. The images are continuous in hue and cover the entire color range. Such techniques, of course, generate color images in real time as distinguished from photographic images. However, these techniques are not useful for producing color images at the low voltages typically used during examination of biological specimens. Moreover, the images produced, although satisfactory, do not provide a substantial amount of information about the specimen.

SUMMARY OF THE INVENTION

The present invention is directed to a color synthesizing scanning electron microscope which produces color images of high information content, which are more easily interpreted and graphically presented than images obtained by prior systems. In a preferred embodiment, the color synthesizing scanning electron microscope, having a scanning primary beam of electrons directed toward a specimen, comprises at least two wide energy bandwidth secondary detectors arranged around the specimen at predetermined variable angles, for receiving electron emission from the specimen subsequent to incidence of the scanning primary electron beam. The secondary detectors detect electrons with trajectory or positional differences and convert the differences to signals for synthesizing color. Means for mixing such signals generate signals representative of different colors.

In a further aspect of the invention, the angles of the detectors vary both laterally around the specimen and vertically. The variation in the vertical angle of the detector is a factor in determining the proportion of secondary to other electrons that are detected.

In another aspect of the invention a differential amplifier generates additional signals for representing a difference between any two input signals from the secondary detectors.

BRIEF DESCRIPTION OF THE DRAWINGS

A preferred embodiment of the present invention is illustrated in and by the following drawings in which like reference numerals indicate like parts and in which.

DETAILED DESCRIPTION OF THE PREFERRED EMBODIMENT

Figure 1:
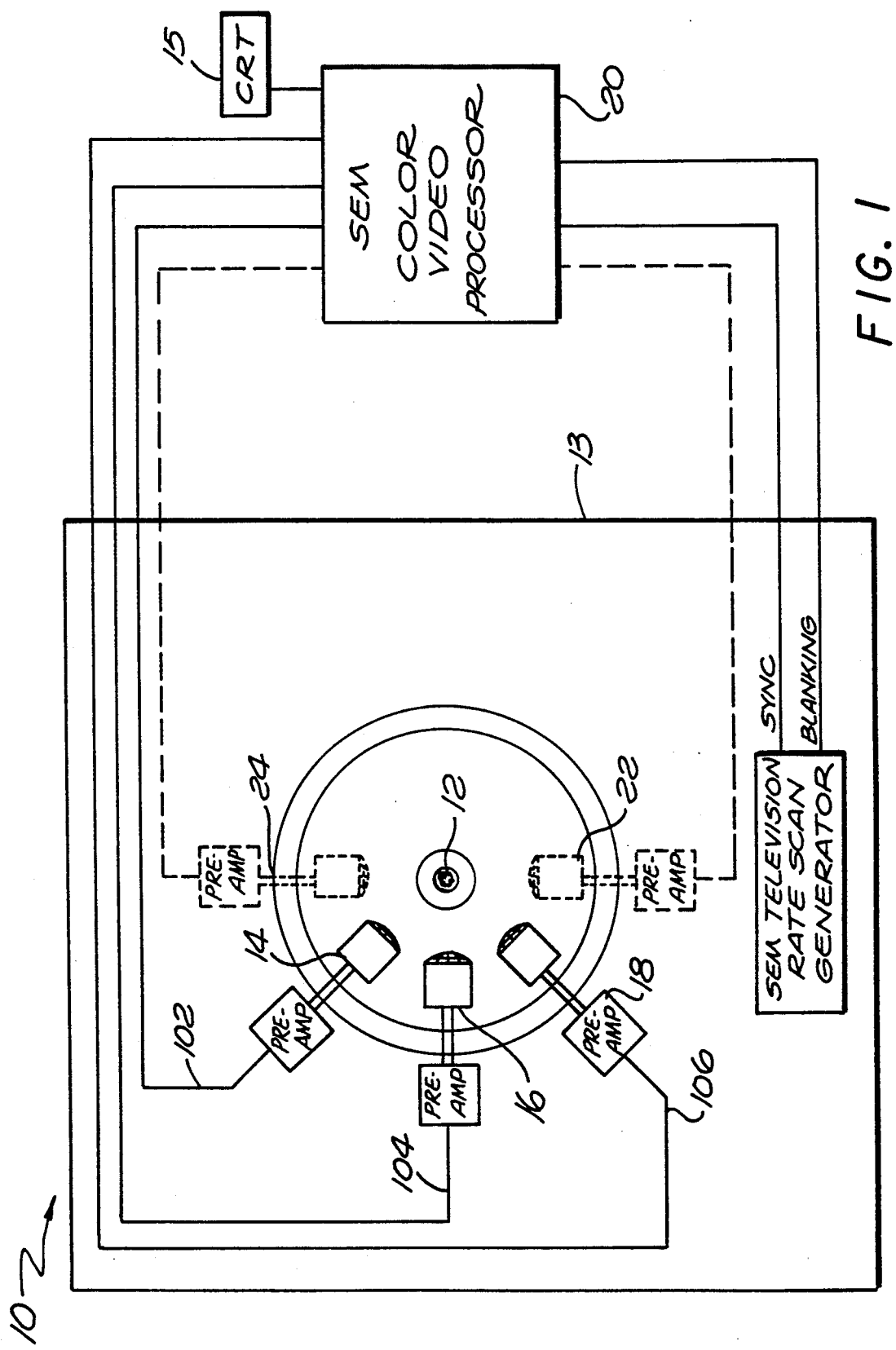
FIG. 1 is a schematic representation of a color synthesizing scanning electron microscope (SEM) in accordance with a preferred embodiment of the present invention.

FIG. 1 illustrates generally a color synthesizing scanning electron microscope 10 in accordance with a preferred embodiment of the present invention. The color synthesizing SEM 10 produces color images of a specimen 12. The color images provide more information about the specimen than prior systems, which is easily interpreted and more graphically presented. The color synthesizing SEM 10 is particularly desirable for examining specimens at low voltages, for example, when the primary electron beam voltage is 5 kV (kilovolts) and under. Biological and uncoated specimens are typically examined at low voltages.

In accordance with a preferred embodiment, the color synthesizing SEM comprises a scanning electron microscope (SEM) 13, of conventional design. Following well known techniques of the scanning electron microscope 13, the surface of the specimen 12 is bombarded with the primary beam of electrons. The specimen 12 emits secondary electrons that are generated by the action of the primary electron beam. These secondary electrons are collected and amplified by the SEM 13. Since the primary electron beam strikes only one point one the specimen 12, the primary electron beam is scanned over the specimen 12 in a raster pattern to generate pictures of the specimen surface 12 which are displayed on a CRT 15.

Major elements of the scanning electron microscope include electromagnetic lenses (not shown) that are used to form the electron probe, the scan coils (not shown) that sweep the primary electron beam over the specimen 12, a detector 14 that collects the secondary electrons, and amplifying means (indicated at block 110 in FIG. 2) where the secondary electrons are amplified and fed to the CRT 15 for display. A conventional vacuum diffusion pump (not shown) is used since a vacuum is required for operation of the primary electron beam.

In a preferred embodiment of the present invention, the SEM is configured such that at least two and preferably three secondary detectors 14, 16 and 18, associated with the scanning electron microscope 10 are positioned around the specimen 12 to receive electron emission from the specimen 12 subsequent to incidence of the scanning primary electron beam to produce images of the specimen surface in color. The images that are formed are easily interpreted because the surface topography, including the illuminating and shadowing effects on the specimen 12 are similar to large objects as normally perceived by the unaided eye. The SEM 13 is connected to a SEM color video processor 20.

The detectors 14, 16 and 18 are configured in accordance with conventional techniques, having suitable electron voltage potentials applied thereto, to attract the secondary electrons. In the preferred embodiment, conventional wide energy bandwidth secondary detectors are used, such as Everhart-Thornley secondary detectors with wideband photomultiplier tubes and electronics. A variable bias ranging between 0 to 300 V (volts) is used for the Faraday cage of the detectors 14, 16 and 18 in order to appropriately distribute the available signal electrons, thus optimizing signal to noise ratio for each detector. Alternatively, other wideband secondary detectors, such as the micro-channel plate type, can be used. The detectors 14, 16 and 18 are arranged around the specimen 12, at a suitable angle to detect electrons with trajectory or positional differences.

Figure 1A:
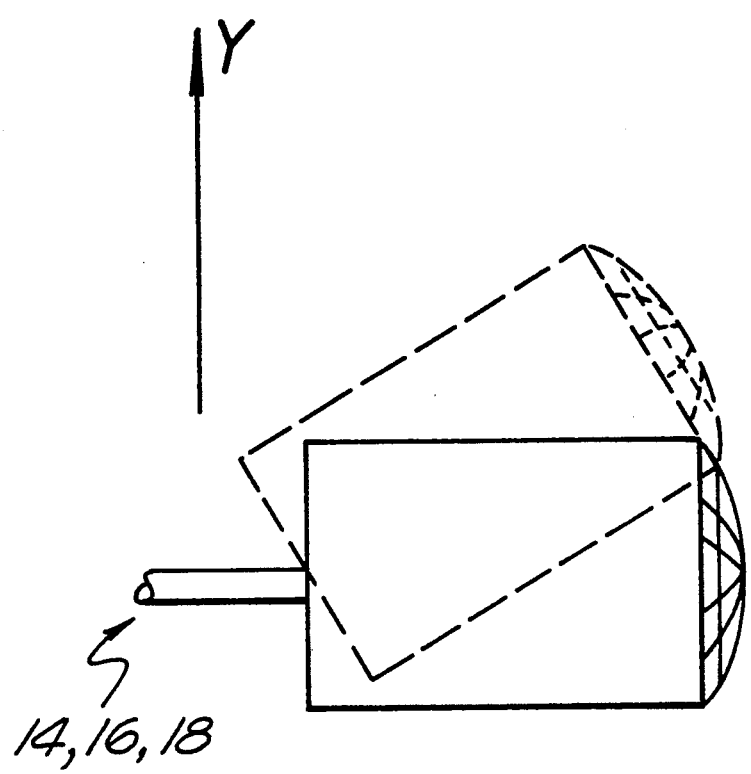
FIG. 1A is a schematic representation of a wide energy bandwidth secondary detector showing the manner in which the angle at which it is oriented can be varied vertically.
Figure 1B:
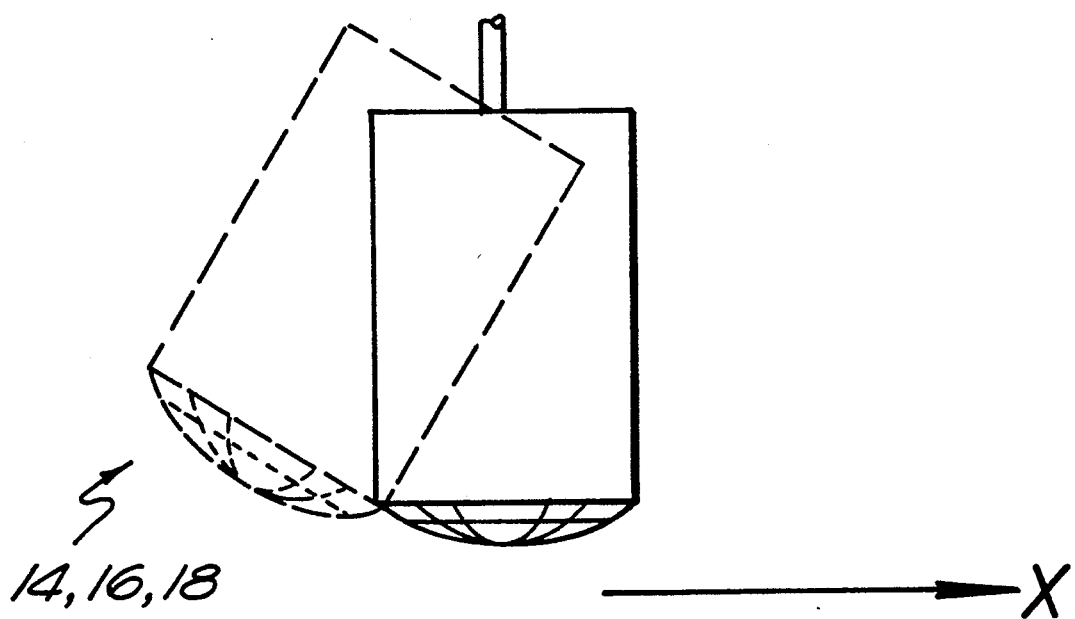
FIG. 1B is a schematic representation of the wide energy bandwidth secondary detector showing the manner in which the angle at which it is oriented can be varied laterally.

As shown in FIGS. 1A and 1B, the angles at which each of the detectors 14, 16 and 18 is arranged can vary both laterally and vertically. The variation in the vertical angle of the detectors 14, 16 and 18 determine the proportion of secondary to other electrons that are detected. In the preferred embodiment, the central detector 16 is oriented upwards, at a suitable angle from the perpendicular (as shown in FIG. 1A) for example 30°, and the detectors 14 and 18 are oriented such that they aim directly at the specimen 12 in order to detect more side-scattered electrons.

More than three detectors (additional detectors 22 and 24 are shown in FIG. 1 in broken lines) with associated input amplifiers, differential amplifiers and RGB mixers can be used. The detectors can be arranged in an arc or a full circle to entirely surround the specimen 12.

Each of the detectors can be turned on or off, as desired, to experiment with various signals for the purpose of image analysis and to adjust "illumination" (chiaroscuro) by the electrons for recording purposes. A back-scatter detector (either solid state, scintillator or micro channel plate (MCP) can also be used to detect back-scattered electrons. If a back-scatter detector is used, a relatively high accelerating beam voltage of 10 kV or 20 kV and above is desired.

Figure 2:
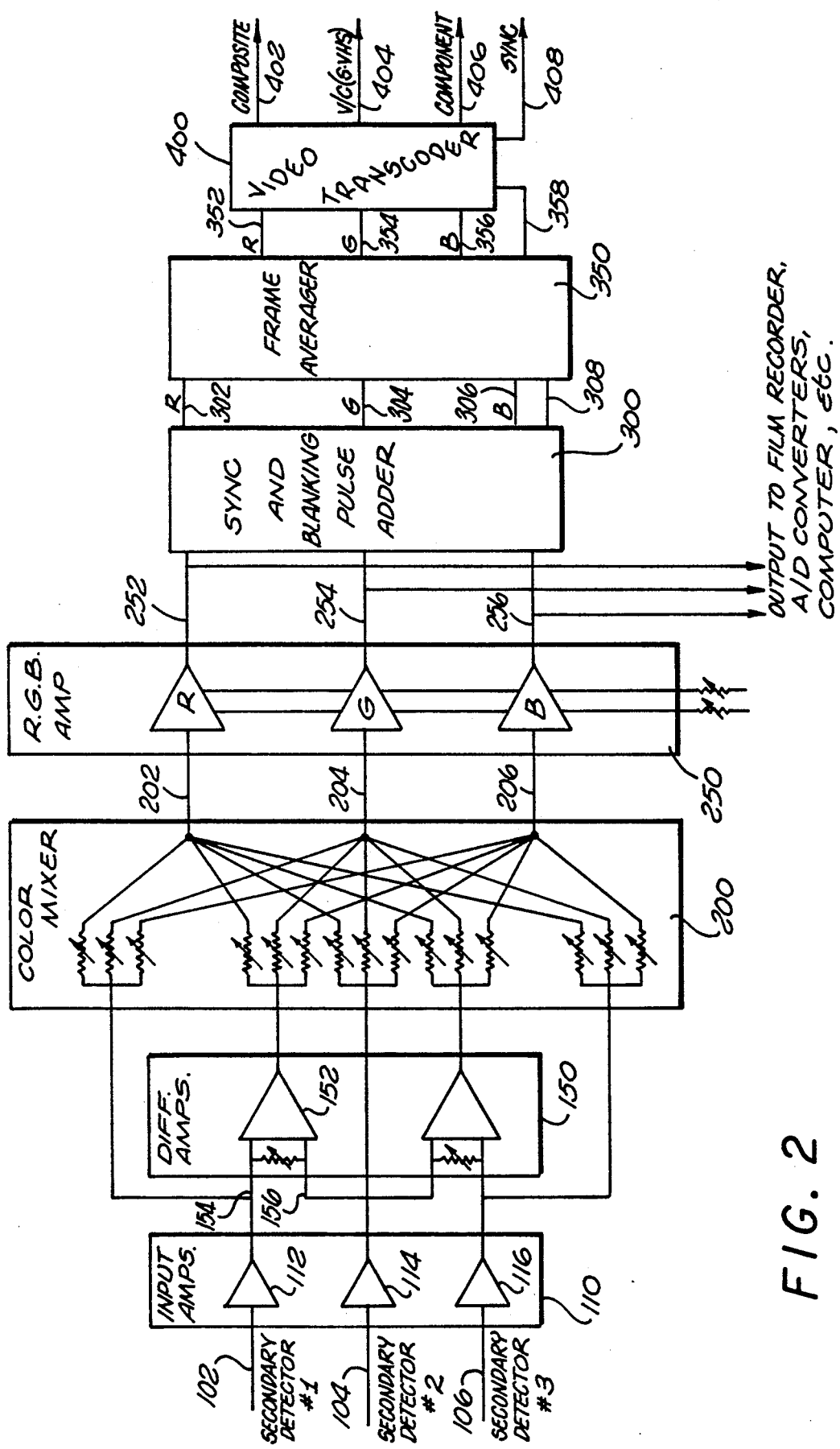
FIG. 2 is a block diagram of the color video processor of the color synthesizing SEM.

FIG. 2 is a block diagram of the color video processor 20 of the color synthesizing SEM 10 of the present invention. The color video processor 20 can be used in applications other than in secondary electron microscopes to derive color signals from three black and white signals. Channels 102, 104 and 106 from each of the wide energy bandwidth secondary detectors 14, 16 and 18, respectively, are connected to an input amplifier 110. The input amplifier 110 comprises three separate input amplifier stages, a first amplifier stage 112 connected to a channel 102, a second amplifier stage 114 connected to a second channel 104 and a third amplifier stage 116 connected to a third channel 106. The amplifier stages 112, 114 and 116 buffer and amplify the channels 102, 104 and 106, respectively, if necessary.

The outputs of the amplifier stages 112, 114 and 116 are connected to a differential amplifier stage 150. The differential amplifier stage 150 generates additional signals at the outputs of the amplifier stages 112, 114 and 116. The differential amplifier stage 150 generates signals representative of the difference between any two of the signals at the outputs of the amplifier stages 112, 114 or 116. This stage is particularly useful for producing a third signal in situations where only two wide energy bandwidth secondary detectors are used. In situations where more than two secondary detectors are used, any number of difference signals may be generated by adding a differential amplifier for each desired difference signal.

The outputs from the differential output stage 150, along with the outputs from the amplifier stages 112, 114 and 116, are connected to a color mixer 200. The color mixer 200 mixes those signals and produces three outputs 202, 204 and 206, each representative of the colors red, green and blue, respectively.

The outputs 202, 204 and 206 from the color mixer 200 are connected to an RGB amplifier stage 250. The RGB amplifier stage 250 amplifies each of the red, green and blue signals at the outputs 202, 204 and 206 from the color mixer 200. The RGB amplifier stage 250 may be adjusted to vary the amount of signal going to each of the output color channels 252, 254 and 256.

The output channels 252, 254 and 256 from the RGB amplifier stage 250 are preferably connected to a sync and blanking stage 300 which adds the appropriate video blanking and sync signals, which are in synchronization with the scanning primary beam of the color synthesizing SEM 10 of the present invention. The sync and blanking stage 300 produces red, green and blue channels 302, 304 and 306, respectively, and a channel monitor signal 308. The red, green and blue channels are video signals and the channel monitor signal 308 is a NTSC composite video signal that enables the operator to monitor the signal and corresponding image of any of channels 112, 114, 116 or 152 in black and white, independent of the color output. This signal may as well be simultaneously noise reduced, transcoded and recorded. Alternatively, the output channels 252, 254 and 256 can be connected to a film recorder, A/D converters, computer or the like.

The output channels 302, 304, 306 and 308 may be then connected to any suitable video equipment for viewing the image produced by the color synthesizing SEM 10. Optionally, the output channels 302, 304, 306 and 308 may be connected to a frame averager 350, of conventional design known to those skilled in the art, for noise reduction. The frame averager 350 produces red, green, blue, and sync output channels 352, 354, 356 and 358.

The output channels 352, 354, 356 and 358 from the frame averager 350 may be optionally connected to a video transcoder 400, of conventional design known to those skilled in the art. The video transcoder 400 produces composite, Y/C (S-VHS), component or other sync output channels 402, 404, 406 and 408, respectively, for connection to appropriate video equipment.

Figure 3:
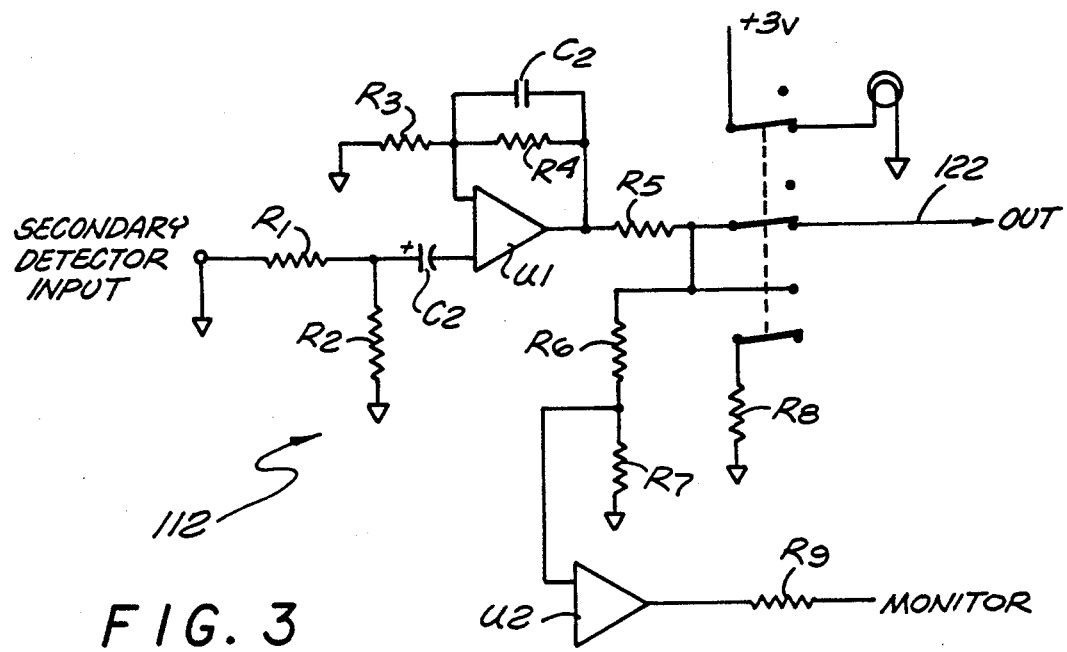
FIG. 3 is a schematic representation of an exemplary input amplifier of the color video processor.

FIG. 3 is a schematic representation of the an exemplary input amplifier stage 110 of the color video processor 20. The secondary detector channels 102, 104 and 106 are connected to the input amplifier stages 112, 114 and 116, respectively, as shown in FIG. 2. The input amplifier stages 112, 114 and 116 are substantially identical and are represented by the circuit diagram shown in FIG. 3. The input amplifier stage 112 has resistors R1, R2, R3, R4, R5, R6, R7, R8 and R9, having exemplary resistance values of 150Ω (ohms), 75Ω, 250Ω, 250Ω, 20Ω, 390Ω, 560Ω, 75Ω and 75Ω, respectively. The input amplifier stage 112 has capacitors C1 and C2, having exemplary capacitance values of 10 μF (microfarads) and 3 pF (picofarads), respectively. The input amplifier stage 112 has an operational amplifier U1, having exemplary part number 621 manufactured by Burr-Brown, and a buffer amplifier U2 to monitor the channels, having exemplary part number 2001 manufactured by Elantec.

A three pole, double throw switch S1 connects or disconnects the input amplifier 112 from an output channel 122 which is connected to the differential amplifier stage 150 (shown in FIG. 2). A pole 126 of the switch 124 is connected to a voltage of preferably 3 V. When the switch 124 is in a connected position, as shown in FIG. 3, the pole 126 is connected to an indicator lamp 128, indicating that the output of the amplifier stage 112 is connected to the output channel 122. When the switch 124 is in a disconnected position, the indicator lamp 128 is disconnected and the output channel 122 is also disconnected from the input amplifier stage 112. The output of the resistor R9 of the input amplifier stage 112 is connected to a monitor select switch 310 (shown in FIG. 7).

Figure 4:
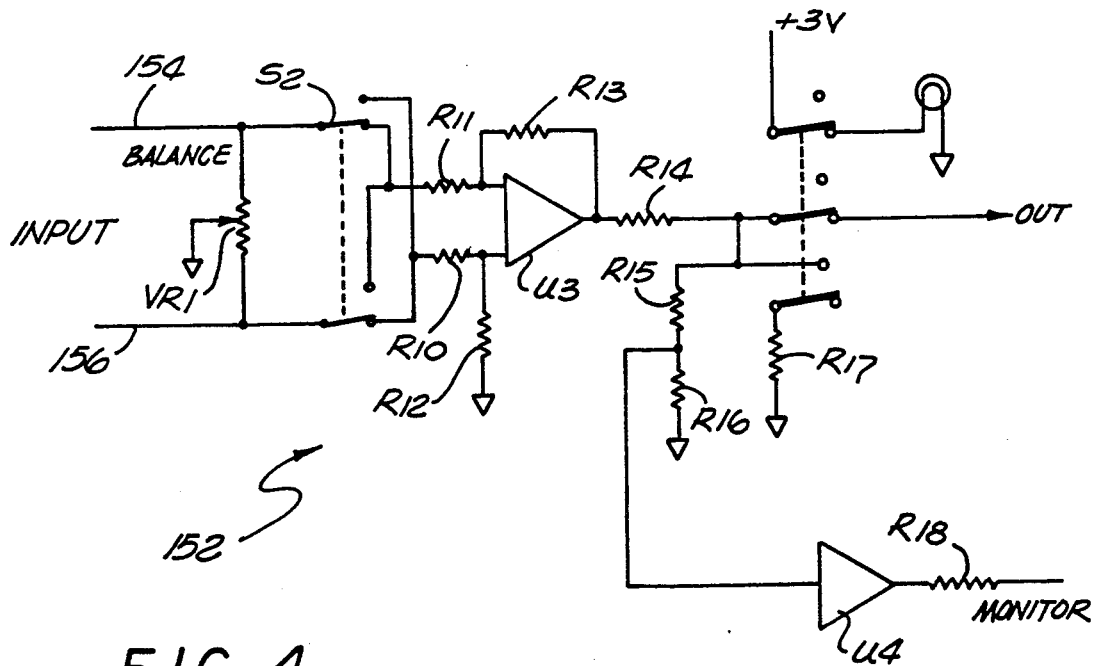
FIG. 4 is a schematic representation of an exemplary differential amplifier of the color video processor.

FIG. 4 is a schematic representation of the differential amplifier 152 of the differential amplifier stage 150 and is exemplary of all the differential amplifiers included within the stage 150. The differential amplifier 152 has a variable resistor VR1, which has an exemplary resistance value of 1 kΩ and which is connected to a double pole, double throw switch S2. The variable resistor VR1 adjusts the balance between inputs 154 and 156 (also shown in FIG. 2). The differential amplifier 152 has resistors R10, R11, R12, R13, R14, R15, R16, R17 and R18, having exemplary resistance values of 110Ω, 110Ω, 250Ω, 250Ω, 20Ω, 560Ω, 390Ω, 75Ω and 75Ω, respectively. The differential amplifier 152 has an operational amplifier U3 having exemplary part number 620 or 621 manufactured by Burr-Brown and a buffer amplifier U4 having exemplary part number 2001 manufactured by Elantec. The output of the resistor R18 is connected to the monitor select switch 310 (shown in FIG. 7).

Figure 5:
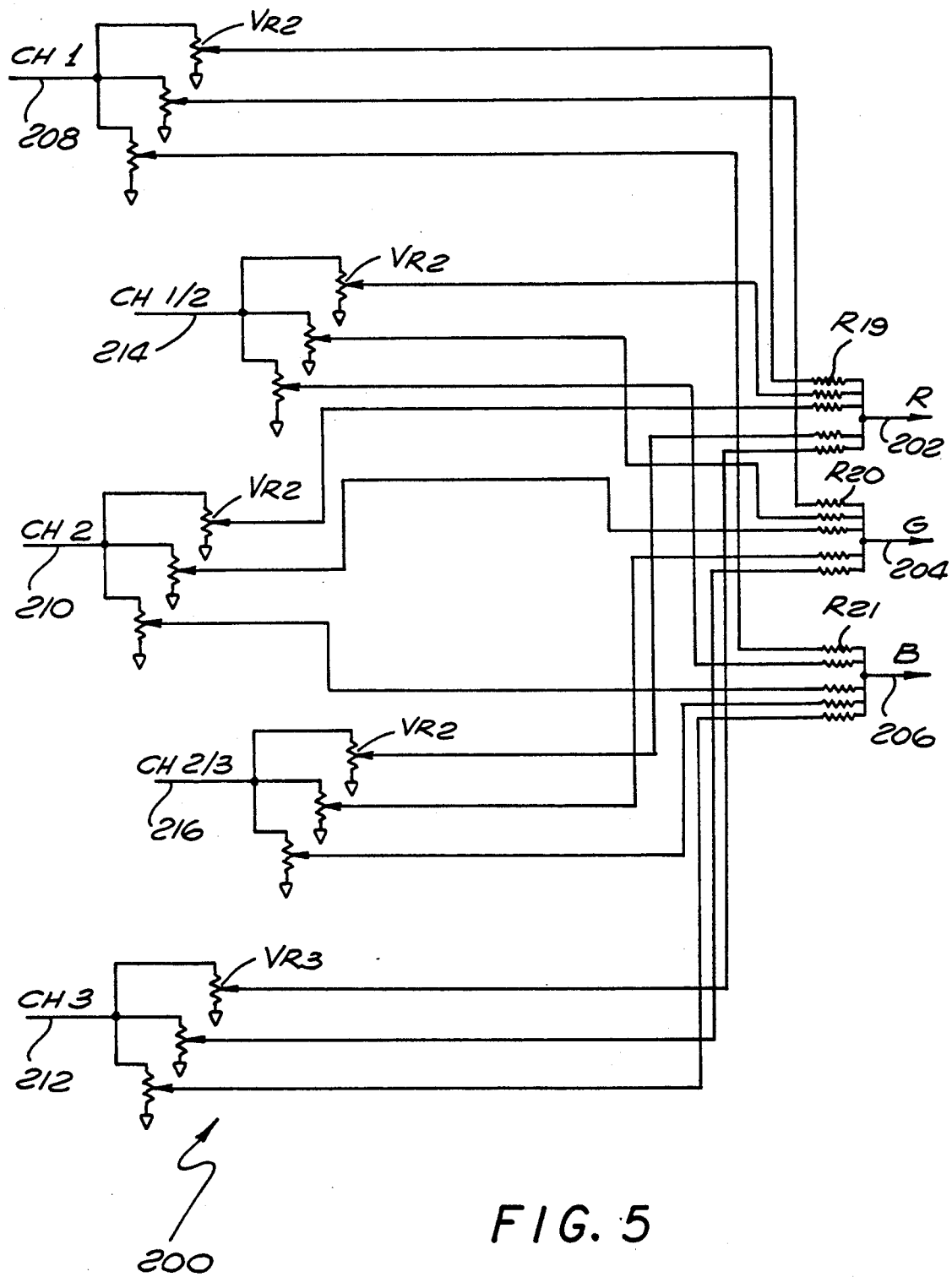
FIG. 5 is a schematic representation of a color mixer of the color video processor.

FIG. 5 is a schematic representation of the color mixer 200 shown for an exemplary configuration of three secondary detector channels 208, 210 and 212, and two differential output channels 214 and 216 from the differential amplifier stage 150. Each channel is connected to three variable resistors, each indicated at VR2 and having an exemplary resistance value of 500Ω. Each variable resistor VR2 is connected to a resistor R19, R20 and R21, each having exemplary resistance values of 250Ω. The resistors R19, R20 and R21 are connected to the red output channel 202, the green output channel 204 and the blue output channel 206, respectively.

Figure 6:
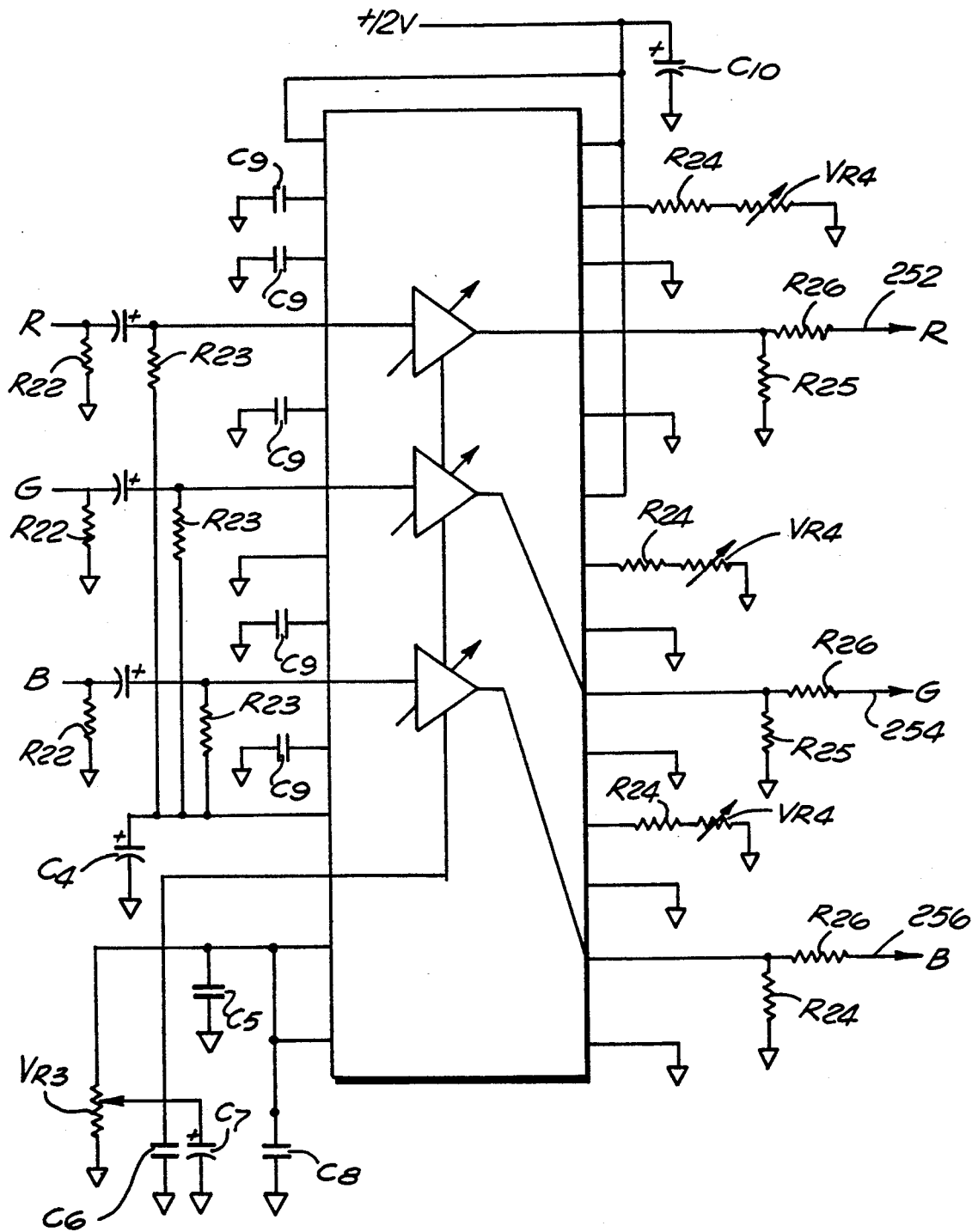
FIG. 6 is a schematic representation of a RGB (Red, Green and Blue) amplifier of the color video processor.

FIG. 6 is a schematic representation of the RGB amplifier 250. The RGB amplifier 250 has preferably three amplifiers on a chip having an exemplary part number LM 1203 manufactured by Texas Instruments. Resistors R22, R23, R24, R25 and R26, have exemplary resistance values of 75Ω, 10kΩ, 150Ω, 390Ω and 75Ω, respectively. The RGB amplifier has a variable resistor VR3 for varying the gain of the red, green and blue outputs, and VR4 for calibrating the gains of each of the red, green and blue output channels 252, 254 and 256, having exemplary resistance values of 10kΩ and 100Ω, respectively. The RGB amplifier has capacitors C3, C4, C5, C6, C7, C8, C9 and C10, having exemplary capacitance values of 10 µF (microfarads), 10 µF, 0.1 µF, 0.1 µF, 10 µF, 0.1 µF, 0.1 µF and 100 µF, respectively. The output channels 252, 254 and 256 from the RGB amplifier stage 250 are preferably connected to a sync and blanking stage 300, as shown in FIG. 2.

Figure 7:
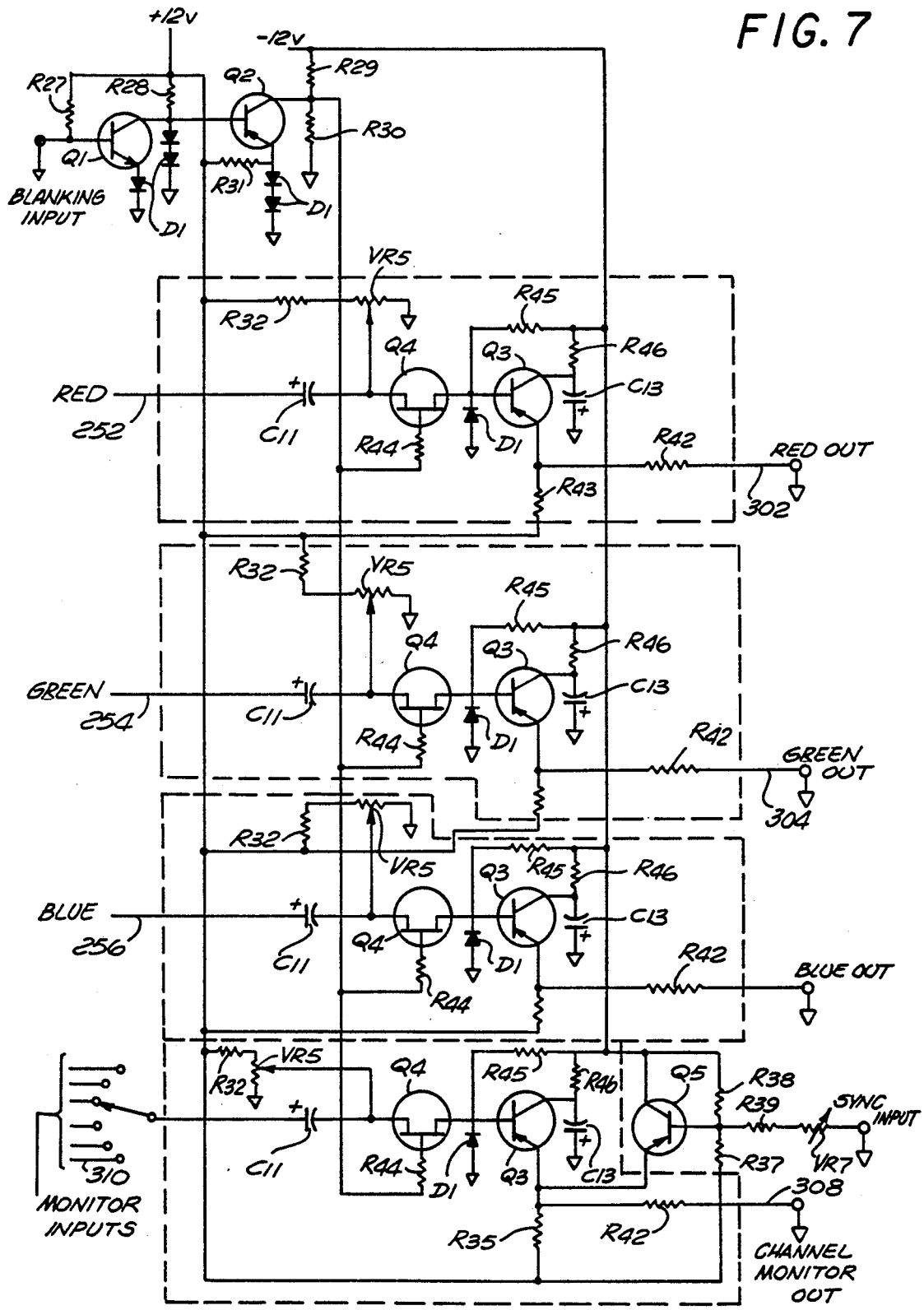
FIG. 7 is a schematic for the circuitry responsible for providing the sync and blanking signals.

FIG. 7 is a schematic representation of the sync and blanking stage 300. A blanking input 302 is connected to an NPN transistor Q1, having an exemplary part number 2N3904 manufactured by Motorola, and a PNP transistor Q2, having an exemplary part number of 2N3906 manufactured by Motorola. Resistors R27, R28, R29, R30 and R31, having exemplary resistance values of 83 kΩ, 24 kΩ, 3.6 kΩ, 24 kΩ, and 1.8 kΩ, and diodes D1, having exemplary part number 1N914, are connected to the transistors Q1 and Q2.

Transistors Q3 and Q4 are coupled between the output 252 from the RGB amplifier 250 and the red output 302 from the sync and blanking pulse adder 300 (shown in FIG. 2) and have exemplary part numbers of 2N4239 and 2N5639, respectively. Resistors R32, R42, R43, R44, R45 and R46, having exemplary resistance values of 39 kΩ, 75Ω, 290Ω, 100Ω, 18 kΩ and 470Ω, respectively, and capacitors C11 and C13, each having an exemplary capacitance value of 100 µF, are connected to the transistors Q3 and Q4. Variable resistor VR5, having an exemplary resistance value of 50 kΩ, adjusts the brightness of the red signal. Diode D1 is connected between the transistors Q3 and Q4.

The circuit connected between the output 254 from the RGB amplifier 250 and the green output 304, the circuit connected between the output 256 from the RGB amplifier 250 and the blue output 306, and the circuit connected between the monitor select switch 310 and a transistor Q5 are all configured in an identical manner with the circuit between the output 252 from the RGB amplifier 250 and the red output 302. Each circuit is shown in FIG. 7 within broken lines.

The transistor Q5 is a PNP transistor having an exemplary part number of 2N3906 manufactured by Motorola. Resistors R37, R38, R39 and variable resistor VR7, having exemplary resistance values of 7.5 kΩ, 27 kΩ, 100Ω and 5 kΩ, are connected between the transistor Q5 and a sync input 312.

Although the invention has been described in terms of a preferred embodiment thereof, other embodiments that will now be apparent to those of ordinary skill in the art are also within the scope of the invention. Accordingly, the scope of the invention is intended to be defined only by reference to the appended claims.

What is claimed is:

1. A color synthesizing scanning electron microscope having a scanning primary beam of electrons directed toward a specimen, comprising:
   at least two wide energy bandwidth secondary detectors arranged around the specimen at variable angles for receiving electron emission from the specimen subsequent to incidence of the scanning primary beam, said secondary detectors detecting electrons with positional differences and converting said positional differences to signals for synthesizing color; and
   means for mixing said signals to generate signals representative of different colors which are indicative of surface topography including illuminating and shadows effects of said specimen.

2. A color synthesizing scanning electron microscope as defined in claim 1, further comprising:
   means for generating additional signals for representing a difference between any two input signals from said secondary detectors.

3. A color synthesizing scanning electron microscope as defined in claim 1, further comprising:
   means for amplifying said signals from said wide energy bandwidth secondary detectors.

4. A color synthesizing scanning electron microscope as defined in claim 1, further comprising:
   means for amplifying said signals representative of different colors.

5. A color synthesizing scanning electron microscope as defined in claim 1, further comprising:
   means for adding video blanking and sync signals to said signals representative of different colors.

6. A color synthesizing scanning electron microscope as defined in claim 1, further comprising:
   frame averaging means for reducing noise in said signals representative of different colors.

7. A color synthesizing scanning electron microscope as defined in claim 1, further comprising:
   video transcoding means for generating video signals from said signals representative of different colors.

8. A color synthesizing scanning electron microscope as defined in claim 1, wherein said secondary detectors are Everhart-Thornley secondary detectors.

9. A color synthesizing scanning electron microscope as defined in claim 1, wherein said angle at which said secondary detector is oriented is varied laterally.

10. A color synthesizing scanning electron microscope as defined in claim 1, wherein said angle at which said secondary detector is oriented is varied vertically.

11. A color synthesizing scanning electron microscope as defined in claim 1, further comprising:
    means for coupling said signals representative of different colors to a film recorder.

12. A color synthesizing scanning electron microscope as defined in claim 1, further comprising:
    means for coupling said signals representative of different colors to an analog to digital converter.

13. A color synthesizing scanning electron microscope as defined in claim 1, further comprising:
    means for coupling said signals representative of different colors a computer.

14. A color synthesizing scanning electron microscope as defined in claim 1, further comprising:
    means for monitoring said signals prior to said signals being mixed to generate signals representative of different colors.

15. A method for generating color images, comprising the steps of:
    directing a scanning primary beam of electrons toward a specimen;
    receiving electron emission from the specimen subsequent to the incidence of the scanning primary beam with at least two wide energy bandwidth secondary detectors arranged around the specimen at predetermined angles, said secondary detectors detecting electrons with positional differences and converting said positional differences to signals for synthesizing color; and
    mixing said signals to generate signals representative of different colors which are indicative of surface topography including illuminating and shadows effects of said specimen.

16. A method for generating color images as defined in claim 15, further comprising the step of:
    generating additional signals for representing a difference between any two input signals from said secondary detectors.

17. A method for generating color images as defined in claim 15, further comprising the step of:
    amplifying said signals from said secondary detectors.

18. A method for generating color images as defined in claim 15, further comprising the step of:
    amplifying said signals representative of different colors.

19. A method for generating color images as defined in claim 15, further comprising the step of:
    adding video blanking and sync signals to said signals representative of different colors.

20. A method for generating color images as defined in claim 15, further comprising the step of:
    reducing noise in said signals representative of different colors with a frame averaging means.

21. A method for generating color images as defined in claim 15, further comprising the step of:
    generating video signals from said signals representative of different colors with a video transcoder means.

* * * * *

US005212383C1

(12) EX PARTE REEXAMINATION CERTIFICATE (4978th)

United States Patent
Scharf

(10) Number: US 5,212,383 C1
(45) Certificate Issued: Aug. 24, 2004

(54) COLOR SYNTHESIZING SCANNING ELECTRON MICROSCOPE

(75) Inventor: David Scharf, 2100 Loma Vista Pl., Los Angeles, CA (US) 90039

(73) Assignee: David Scharf, Los Angeles, CA (US)

Reexamination Request:
No. 90/006,325, Jul. 11, 2002

Reexamination Certificate for:
Patent No.: 5,212,383
Issued: May 18, 1993
Appl. No.: 07/737,942
Filed: Jul. 29, 1991

(51) Int. Cl.$^7$ .................................................. H01J 37/28
(52) U.S. Cl. ........................................ 250/310; 250/397
(58) Field of Search ................................ 250/306, 307, 250/309, 310, 311, 397

(56) References Cited

U.S. PATENT DOCUMENTS

| | | | | |
|---|---|---|---|---|
| 3,628,014 A | 12/1971 | Gruble, Jr. | | 250/49.5 A |
| 4,426,577 A | 1/1984 | Koike et al. | | 250/310 |
| 4,560,872 A | 12/1985 | Antonovsky | | 250/310 |
| 4,897,545 A | 1/1990 | Danilatos | | 250/310 |
| 5,001,344 A | * 3/1991 | Kato et al. | | 250/307 |

FOREIGN PATENT DOCUMENTS

JP        62-112005 A      5/1987

OTHER PUBLICATIONS

Rau et al., "Colour Encoding of Video Signals in SEM", Feb. 2, 1908, SCANNING vol. 3,3 (1980), 242–246.*
"Direct recording of stereoscopic images with the scanning electron microscope by the anaglyph colour technique", A. Boyde, Scanning Electron Microscopy, Medical and Biological Illustration (1971), 21, pp. 130–133.
"Colour Encoding of Video Signals in SEM", E.I. Rau et al., Department of Physics, Moscow University, Moscow 117234, USSR; pp. 242–248; SCANNING vol. 3, 3(1980).

* cited by examiner

*Primary Examiner*—John R. Lee

(57) ABSTRACT

A color synthesizing scanning electron microscope having a scanning primary beam of electrons directed toward a specimen, is configured to produce color images of high information content. The microscope comprises at least two wide energy bandwidth secondary electron detectors, arranged around the specimen at predetermined variable angles, for receiving electron emission from the specimen subsequent to incidence of the scanning primary electron beam. The wide energy bandwidth secondary detectors detect electrons with trajectory or positional differences and convert the positional differences to signals for synthesizing color. The signals from the wide energy bandwidth secondary electron detectors are combined to generate signals representative of different colors. Additional signals representing a difference between any two input signals from the wide energy bandwidth secondary detectors can also be generated.

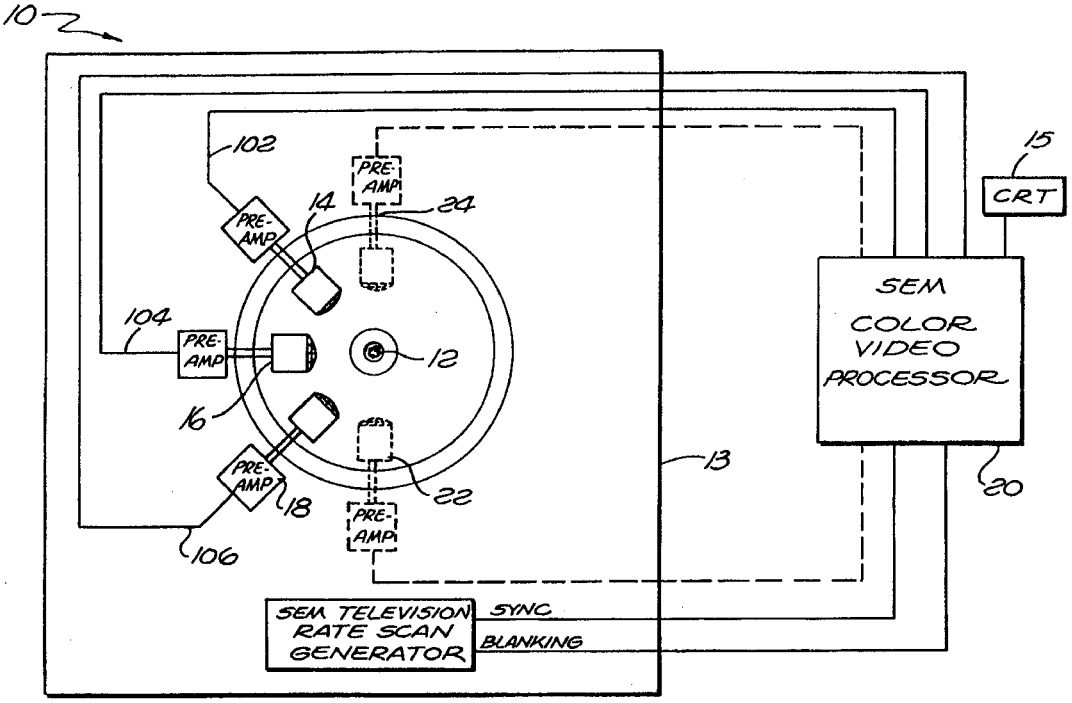

EX PARTE REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

The patentability of claims 1–21 is confirmed.

New claims 22–26 are added and determined to be patentable.

*22. A color synthesizing scanning electron microscope as defined in claim 1, further comprising variable biasing for said secondary detectors to appropriately distribute the available electrons.*

*23. A method for generating color images as defined in claim 15, further comprising biasing one or more of said secondary detectors with a signal having a voltage of at least zero to appropriately distribute the available electrons.*

*24. A method for generating color images comprising as defined in claim 15, further arranging said secondary detectors around said specimen at variable lateral and vertical angles, and variably biasing one or more of said secondary detectors to appropriately distribute the available electrons.*

*25. A method for generating color images as defined in claim 15, further comprising the step of generating additional signals for representing a difference between any two input signals from said secondary detectors.*

*26. A method for generating color images as defined in claim 25, further comprising the step of mixing said signals received from said secondary detectors with said additional signals to represent color signals.*

* * * * *